US010591558B2

(12) United States Patent
Li

(10) Patent No.: US 10,591,558 B2
(45) Date of Patent: Mar. 17, 2020

(54) INFORMATION DISPLAY DEVICE AND CONTROL DEVICE OF MEDICAL EQUIPMENT

(71) Applicant: Shun Feng Li, Shenzhen (CN)

(72) Inventor: Shun Feng Li, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 1185 days.

(21) Appl. No.: 14/634,829

(22) Filed: Feb. 28, 2015

(65) Prior Publication Data

US 2015/0247905 A1 Sep. 3, 2015

(30) Foreign Application Priority Data

Feb. 28, 2014 (CN) .......................... 2014 2 0091976

(51) Int. Cl.
*G01R 33/28* (2006.01)
*H04N 5/74* (2006.01)
*H04N 9/31* (2006.01)
*G06F 3/0488* (2013.01)

(52) U.S. Cl.
CPC ......... *G01R 33/283* (2013.01); *G06F 3/0488* (2013.01); *H04N 5/7475* (2013.01); *H04N 9/3185* (2013.01); *H04N 9/3194* (2013.01)

(58) Field of Classification Search
CPC .............................. G02B 23/2469; A61B 1/07
USPC .................................................. 362/551–582
See application file for complete search history.

(56) References Cited

U.S. PATENT DOCUMENTS

| 5,134,373 | A | * | 7/1992 | Tsuruno | G01R 33/283 |
| | | | | | 359/872 |
| 7,567,833 | B2 | * | 7/2009 | Moctezuma De La Barrera ........ | |
| | | | | | A61B 90/35 |
| | | | | | 362/572 |
| 9,532,727 | B2 | * | 1/2017 | Herold | A61B 5/055 |
| 2005/0229103 | A1 | * | 10/2005 | King | A61F 4/00 |
| | | | | | 715/741 |

FOREIGN PATENT DOCUMENTS

CN 203133465 U 8/2013

* cited by examiner

*Primary Examiner* — William J Carter
(74) *Attorney, Agent, or Firm* — Lempia Summerfield Katz LLC

(57) ABSTRACT

An information display device and a control device of medical equipment are provided. The information display device of medical equipment includes at least one projection unit for acquiring display information, and projecting the display information onto a housing of the medical equipment. The information display device includes a host for providing an electrical signal of the display information, an optical fiber converter for converting the electrical signal to an optical signal, and an optical fiber for relaying the optical signal to the projection unit. Various display information about medical equipment is not displayed through an electronic display screen, but the display information is projected onto the housing of the medical equipment by an additional projection unit.

10 Claims, 3 Drawing Sheets

INFORMATION DISPLAY DEVICE AND CONTROL DEVICE OF MEDICAL EQUIPMENT

This application claims the benefit of CN 201420091976.X, filed on Feb. 28, 2014, which is hereby incorporated by reference in its entirety.

TECHNICAL FIELD

The present embodiments relate to the field of medical equipment, and in particular, to an information display device and a control device of medical equipment.

BACKGROUND

Medical equipment has become an important field of modern medicines. Medical equipment refers to instruments, devices, appliances, materials or other items applied to a human body alone or in combination, and also includes required software.

An electronic display screen integrated on medical equipment may be used to display various display information (e.g., patient information, medical equipment operation interface, prompt information, etc.). Medical equipment may be located in complicated electromagnetic field environments, and the electronic display screen is prone to be affected by the environments. Many off-the-shelf display-devices may not be directly applied to medical environments. However, the costs of specially designing a display screen for adapting to the medical environments are very-high. In addition, in order to accommodate the electronic display screen, additional wiring work is to be performed on the medical equipment. After the display-screen is installed, both the position and the size of the display region may not be adjusted, and thus, numerous individual needs may not be satisfied.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an information display device of medical equipment configured so as to improve environment applicability is provided.

In one embodiment, an information display system of medical equipment configured so as to improve environment applicability is provided.

In one embodiment, a control device of medical equipment configured so as to improve environment applicability is provided.

An information display device of medical equipment includes at least one projection unit for acquiring display information, and projecting the display information onto the housing of the medical equipment.

A fixation unit for fixing the projection unit is also included.

The fixation unit is arranged on the roof and/or an inner wall of a house.

The arrangement position of the fixation unit is fixed or adjustable.

The medical equipment is a magnetic resonance imaging system, and the projection range of the projection unit includes at least one of the following: an upper portion of a front opening of a rack of the magnetic resonance imaging system; a left portion of the front opening of the rack of the magnetic resonance imaging system; a right portion of the front opening of the rack of the magnetic resonance imaging system; an upper portion of a rear opening of the rack of the magnetic resonance imaging system; a left portion of the rear opening of the rack of the magnetic resonance imaging system; and a right portion of the rear opening of the rack of the magnetic resonance imaging system.

There are a plurality of projection units, and the information display device further includes a splitter for splitting the display information as multiple channels of sub-display information, and sending each channel of sub-display information to the corresponding projection unit.

An information display system of medical equipment includes the information display device, as described above. The information display system also includes a host for providing an electrical signal of the display information, an optical fiber converter for converting the electrical signal to an optical signal, and an optical fiber for relaying the optical signal to the projection unit.

A control device of medical equipment includes the information display, a light capture device for capturing light change information about a display image projected onto the housing of the medical equipment, a position encoder for determining a control instruction based on the light change information, and a control unit for controlling the medical equipment based on the control instruction.

The position encoder is an optical position encoder. The control device further includes a photoelectric converter arranged between the position encoder and the control unit for converting a light control instruction determined by the optical position encoder to an electrical control instruction. The control device also includes the control unit for controlling the medical equipment according to the electrical control instruction.

The control device also includes at least one of the following: a sickbed control unit for controlling a sickbed in response to the electrical control instruction; a sound control unit for controlling sound in response to the electrical control instruction; a ventilation control unit for controlling a fan in response to the electrical control instruction; and a temperature control unit for controlling an air conditioner in response to the electrical control instruction.

In the embodiments, at least one projection unit is used for acquiring display information and projecting the display information onto the housing of medical equipment. After the present embodiment are applied, various display information about medical equipment is not displayed through an electronic display screen, but the display information is projected onto the housing of the medical equipment by an additional projection unit, which may avoid adverse effects of complicated medical environments on electronic display devices. Thus, an information display region may be flexibly adjusted.

Using an optical fiber converter to convert display information from an electrical signal format to an optical signal format and then using an optical fiber to relay the display information to a projection unit, rather than directly sending the display information in the electrical signal format to the projection unit for projection, may avoid the defect that the display information in the electrical signal format is prone to be affected by a medical environment magnetic field during transmission.

DETAILED DESCRIPTION

The present embodiments are further described in detail below in conjunction with the accompanying drawings in order to make the technical solutions and advantages of the present embodiments clearer and more apparent. Specific embodiments described herein are merely used for illustration and are not intended to limit the scope of protection.

The technical solution of the present embodiments may not be limited to the details above and below during implementation. Some embodiments are not described in detail. Rather, only frameworks are provided. Hereinafter, the expression "comprising" refers to "comprising, but not limited to," and "according to" refers to "at least according to, but not limited to only according to." Hereinafter, when the number of a component is not particularly pointed out, the component may be one and may also be several, or may be understood to be at least one.

Various display information (e.g., patient information, medical equipment operation interface, prompt information, etc.) about medical equipment is not displayed through an electronic display screen, but the display information is projected onto the housing of the medical equipment and/or onto an inner wall of a house by an additional projection unit. This may avoid adverse effects of complicated medical environments on electronic display devices. Thus, an information display region may be flexibly adjusted.

Figure 1:
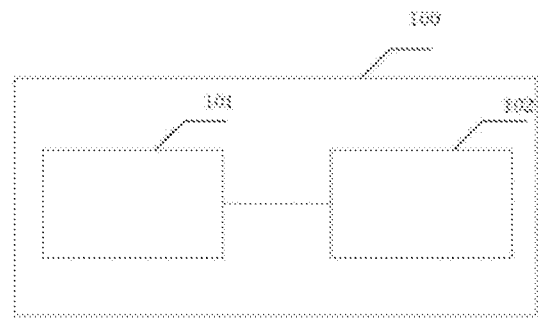
FIG. 1 shows one embodiment of an information display device of medical equipment.

FIG. 1 is a structural diagram of one embodiment of an information display device of medical equipment.

As shown in FIG. 1, the information display device 100 includes at least one projection unit 101 for acquiring display information and projecting the display information onto the housing of the medical equipment.

The projection unit 101 may acquire any types of display information from various display information provision units of the medical equipment through various communication modes. For example, the display information may include patient information, sickbed information, medical equipment operation interface, prompt information, etc.

The communication modes adopted by the projection unit 101 and the various display information provision units of the medical equipment include, for example, wireless communication and wired communication modes, such as infrared communications, Bluetooth communications, optical fiber communications and wireless local area network communications. After acquiring the display information, the projection unit 101 projects the display information onto a projection medium in the form of images or videos. In one embodiment, the projection medium includes the housing of the medical equipment and the inner wall of the house where the medical equipment is located.

Exemplarily, the projection unit 101 may be specifically embodied as a cathode-ray tube (CRT) three-gun projector. The input display information is decomposed onto fluorescent screens of three CRTs (e.g., R (red), G (green) and B (blue)), fluorescent powders emit light under a high voltage, and the system amplifies, converges and displays a color image on the projection medium.

Exemplarily, the projection unit 101 may also be specifically embodied as a liquid crystal display (LCD) projector. The projector unit 101 may either be embodied as a liquid crystal board projector, or may be embodied as a liquid crystal light valve projector. The LCD projector uses liquid crystal photoelectric effects. The arrangement of liquid crystal molecules change under the act of an electric field, affecting the transmittance or the reflectance of a liquid crystal unit projector thereof, and thus affecting the optical properties thereof, so as to generate an image with different gray levels and colors.

Exemplarily, the projection unit 101 may also be specifically embodied as a digital light processor (DLP) projector. The DLP projector uses a digital micro reflector (DMD) as a light valve imaging device. Light beams are projected onto the DMD after passing through a high-speed rotating three-color lens, and then projected onto a large screen through an optical lens to complete image projection.

The specific examples of the projection unit 101 are described above exemplarily, and those skilled in the art will appreciate that such a description is merely exemplary and is not intended to limit the scope of protection of the embodiments of the invention.

The projection unit 101 may project display information onto the housing of the medical equipment, and thus may reduce adverse effects of complicated medical environments on display results.

In an embodiment, the information display device 100 may also include a fixation unit 102 for fixing the projection unit 101.

The fixation unit 102 may be embodied as various mechanical forms, such as, for example, a fixation hinge, a fixation spring, a support frame, or another mechanical form.

In one embodiment, the fixation unit may be arranged on the roof or a wall of a house for accommodating the medical equipment, and thus may have a larger projection range. The arrangement position of the fixation unit 102 is fixed or adjustable.

By adjusting the arrangement position of the fixation unit 102 or projection parameters of the projection unit 101, the projection range of the projection unit 101 may be changed.

When the medical equipment is a magnetic resonance imaging system, the projection range of the projection unit 101 may include at least one of the following: an upper portion of a front opening of a rack of a magnetic resonance imaging system; a left portion of the front opening of the rack of the magnetic resonance imaging system; a right portion of the front opening of the rack of the magnetic resonance imaging system; an upper portion of a rear opening of the rack of the magnetic resonance imaging system; a left portion of the rear opening of the rack of the magnetic resonance imaging system; a right portion of the rear opening of the rack of the magnetic resonance imaging system, etc.

Magnetic resonance imaging equipment is taken as an example below to describe the present embodiments in detail. In a magnetic resonance imaging system, due to the existence of a magnetic field, various electronic display devices will be easily affected.

Figure 2:
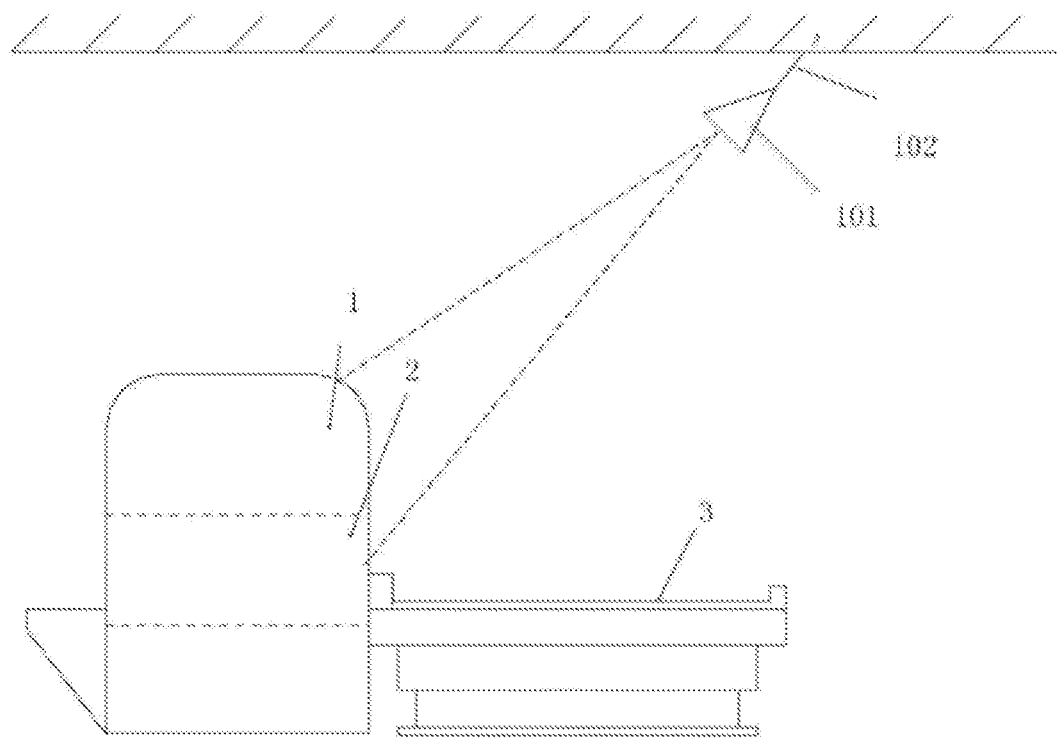
FIG. 2 shows one embodiment of information display of a magnetic resonance imaging system.

FIG. 2 is a schematic diagram of one embodiment of an information display of a magnetic resonance imaging system.

As shown in FIG. 2, the magnetic resonance imaging system includes a rack 1. The rack includes a magnet unit, and forms a main magnetic field and a gradient magnetic field in a cavity 2. The magnetic resonance imaging system also includes a bed board 3. The bed board 3 movably gets into and out of the cavity 2. The bed board 3 may be arranged above a support frame that plays a supporting role, and the support frame may generally be fixed.

The magnetic resonance imaging system further includes a fixation unit 102 installed in a position A on the roof of a house, and a projection unit 101 constituting an integrated assembly with the fixation unit 102.

The projection unit 101 is used for acquiring display information and projecting the display information onto the housing of the rack 1.

Based on application environments and requirements, the host of the magnetic resonance imaging system may generate information to be displayed during a magnetic resonance imaging process. The projection unit 101 may acquire display information from the host of the magnetic resonance imaging system via wireless communication and wired communication modes, such as infrared communications, Bluetooth communications, optical fiber communications, and wireless local area network communications.

In one embodiment, the fixation unit 102 is movable on the roof of the house, and thus, the projection range may be adjusted flexibly.

The projection range of the projection unit 101 may include at least one of the following: an upper portion of a front opening of the cavity 2 of the rack 1; a left portion of the front opening of the cavity 2 of the rack 1; a right portion of the front opening of the cavity 2 of the rack 1; an upper portion of a rear opening of the cavity 2 of the rack 1; a left portion of the rear opening of the cavity 2 of the rack 1; a right portion of the rear opening of the cavity 2 of the rack 1, etc.

Figure 3:
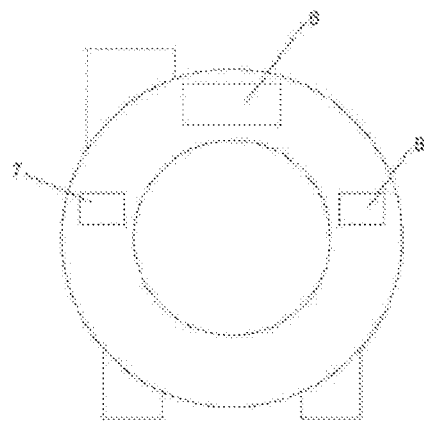
FIG. 3 shows an exemplary information display position.

FIG. 3 is an exemplary schematic diagram of one embodiment of an information display position.

As shown in FIG. 3, there is a display region 6 right above a front opening of the cavity 2 of the rack 1, there is a display region 7 on a left half portion of the front opening of the cavity 2 of the rack 1, and there is a display region 8 on a right half portion of the front opening of the cavity 2 of the rack 1.

For example, user display information that plays a prompt role, such as patient direction information, sickbed position information, and connection coil information may be displayed in the display region 6 by projection.

In one embodiment, a medical equipment operation interface in the form of a control panel may be displayed in the display region 7 or 8 by projection. The control panel is used for controlling a magnetic resonance imaging system. Various control trigger controls are displayed in any representation forms, such as a button and a key, in the control panel.

The magnetic resonance imaging system is taken as an example to perform the exemplary description, and those skilled in the art will appreciate that such a description is merely exemplary, and is not intended to limit the scope of protection of the invention.

In practice, the present embodiments may also be applied to other medical equipment, and is, for example, applied to medical equipment with complicated electromagnetic environments, such as CT equipment and PET equipment.

Examples of information display positions are listed above in detail, and those skilled in the art will appreciate that such a list is merely exemplary, and is not intended to limit the invention.

Figure 4:
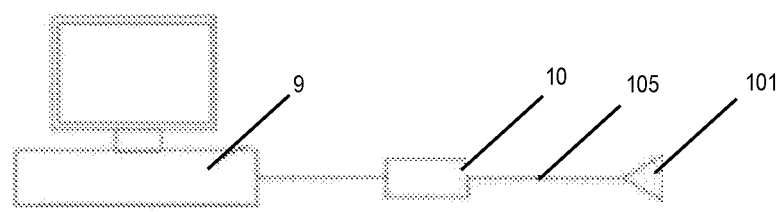
FIG. 4 shows an exemplary connection between an information display device and a host.

FIG. 4 is a schematic diagram of an exemplary connection between an information display device and a host of medical equipment.

As shown in FIG. 4, a projection unit 101 of the information display device is connected to a host 9 through an optical fiber converter 10 and an optical fiber 105.

The host 9 is used for providing display information in an electrical signal format. The optical fiber converter 10 is used for converting the format of the display information specifically in the electrical signal format to an optical signal format. The optical fiber 105 is used for relaying the display information converted to the optical signal format to the projection unit 101 of the information display device.

Using the optical fiber converter 10 to convert the display information from the electrical signal format to the optical signal format and then using the optical fiber 105 to relay the display information to the projection unit 101, rather than directly sending the display information in the electrical signal format to the projection unit 101, may avoid the situation where the display information in the electrical signal format is prone to be affected by medical equipment magnetic field during transmission.

Figure 5:
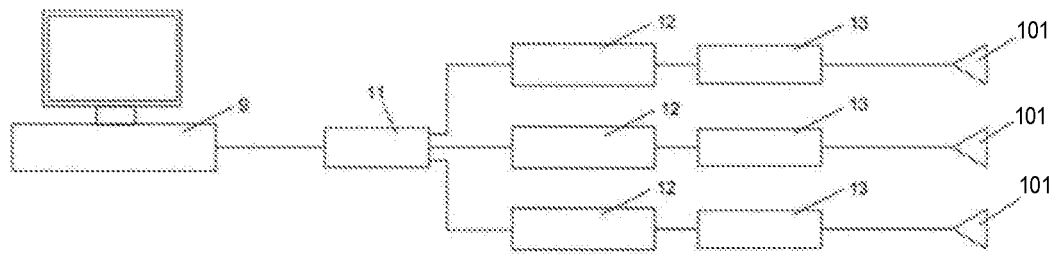
FIG. 5 shows one embodiment of an information display device corresponding to a plurality of projection units.

FIG. 5 is a structural diagram of one embodiment of an information display device corresponding to a plurality of projection units.

As shown in FIG. 5, an information display device is provided with a plurality of projection units 101. Each projection unit 101 is respectively connected to a host 9 through a respective optical fiber 13 and optical fiber converter 12 thereof.

The host 9 is used for providing display information in an electrical signal format. A splitter 11 is used for splitting the display information as multiple channels of sub-display information and sending each channel of sub-display information to a corresponding projection unit 101. The optical fiber converter 12 connected to the splitter 11 is respectively used for converting the sub-display information in the electrical signal format to an optical signal format. An optical fiber 105 connected to the projection unit 101 is used for relaying corresponding sub-display information in the optical signal format to a respective projection unit 101 thereof.

Based on the above description, a control device of medical equipment is provided.

Figure 6:
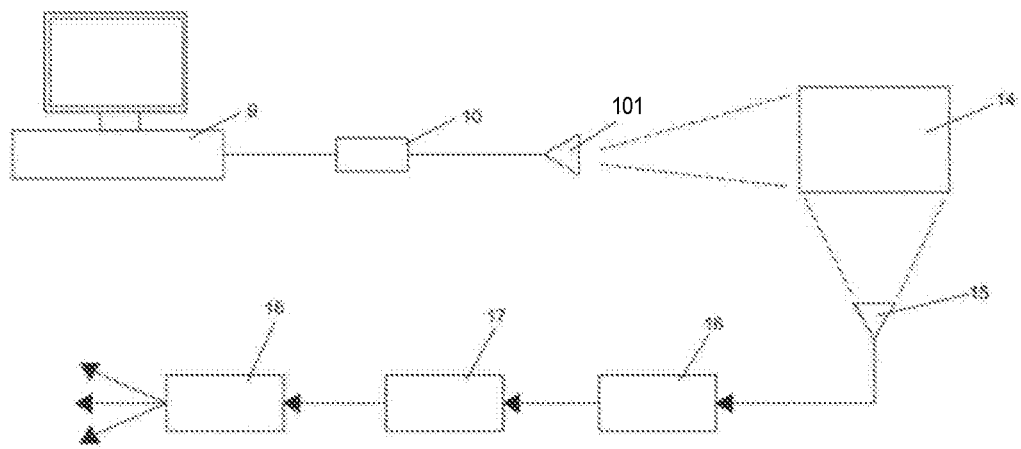
FIG. 6 shows one embodiment of a control device of medical equipment.

FIG. 6 is a structural diagram of one embodiment of a control device of medical equipment.

As shown in FIG. 6, a projection unit 101 of an information display device is connected to a host 9 through an optical fiber converter 10.

The host 9 is used for providing display information in an electrical signal format. The optical fiber converter 10 is used for converting the display information in an electrical signal format to an optical signal format. An optical fiber 105 is used for relaying the display information in the optical signal format to the projection unit 101 of the information display device.

The projection unit 101 projects a display signal onto a display region 14 in the housing of the medical equipment or an inner wall of a house. A control panel for controlling the medical equipment is displayed in the display region 14 by projection, and various control trigger controls are displayed in any representation forms, such as a button and a key, in the control panel.

When a user touches the control panel in the display region 14 with his/her hand, an optical image of the control panel will change (e.g., the luminance of the touch point changes). A light capture device 15 captures light change information about the optical image, and sends the light change information to an optical position encoder 16.

A light control instruction corresponding to the light change information is pre-stored in the optical position encoder 16. After receiving the light change information, the optical position encoder 16 determines a corresponding light control instruction based on the light change information.

A photoelectric converter 17 is arranged between the position encoder 16 and a control unit 18, and may convert a light control instruction determined by the optical position encoder 16 to an electrical control instruction. Then, the control unit 18 may control the medical equipment to execute various actions based on the electronic control instruction.

The control device further includes at least one of the following controlled execution units: a sickbed control unit for controlling the movement of a sickbed in response to the electronic control instruction, for example, changing the movement speed of the sickbed, changing the movement direction of the sickbed, etc.; a sound control unit for controlling sound in response to the electronic control instruction, for example, starting to issue prompt audio, increasing the audio volume, decreasing the audio volume, etc.; a ventilation control unit for controlling a fan in response to the electronic control instruction, for example, turning on the fan, turning off the fan, changing the fan speed, etc.; and a temperature control unit for controlling an air conditioner in response to the electronic control instruction, for example, turning on the air conditioner, turning off the air conditioner, changing the temperature settings, etc.

Not all of the steps and modules in each of the above-mentioned flows and structural diagrams are necessary, and it is possible to ignore certain steps or modules according to actual needs. The execution sequence of each step is not fixed and may be adjusted as needed. The division of various modules is merely a division in functions adopted for the purpose of facilitating description, and in actual implementation, one module may be respectively implemented by a plurality of modules, and the functions of the plurality of modules may also be implemented by the same module. These modules may be located in the same device and may also be located in different devices.

Hardware modules in each embodiment may be implemented mechanically or electrically. For example, a hardware module may include a specially designed permanent circuit or logical device (e.g., a dedicated processor, such as FPGA or ASIC) for completing a specific operation. The hardware module may also include a programmable logic device or circuit (e.g., including a general-purpose processor or other programmable processors) that is configured by software temporarily for carrying out a specific operation. It may be determined, according to the considerations of cost and time, whether to implement the hardware module specifically in a mechanical manner, or by adopting a dedicated permanent circuit, or by adopting a circuit that is temporarily configured (e.g., configured by software).

A machine-readable storage medium (e.g., a non-transitory computer-readable storage medium) that stores instructions for making a machine perform the operation as described herein is also provided. A system or a device with a storage medium, on which software program codes are stored for implementing the functions of any of the above-mentioned embodiments, may be provided, and a computer (e.g., CPU or MPU) of the system or device may read and execute the program codes stored in the storage medium. In addition, an operating system running in a computer may complete a part of or all of the actual operations using instructions based on the program codes. The program codes read from the storage medium may also be written into a memory provided in an extension board inserted inside the computer or into a memory provided in an extension unit connected to the computer. Subsequently, the instructions based on the program codes cause the CPU mounted on the extension board or the extension unit to carry out a part of or all of the actual operations, thereby realizing the function of any one of the above-mentioned embodiments.

The embodiments of the storage medium for providing program codes include a floppy disk, a hard disk, a magnetic optical disk, an optical disk (e.g., CD-ROM, CD-R, CD-RW, DVD-ROM, DVD-RAM, DVD-RW, and DVD+RW), a magnetic tape, a non-volatility memory card, and a ROM. Selectively, the program codes may be downloaded from a server computer via a communication network.

In the embodiments described above, the projection unit is used for acquiring display information, and projecting the display information onto the housing of medical equipment and/or projecting the display information onto an inner wall of a house. After the present embodiments are applied, various display information about the medical equipment is not displayed through an electronic display screen, but the display information is projected onto the housing of the medical equipment by an additional projection unit that may avoid adverse effects of complicated medical electromagnetic environments on electronic display devices. Thus, an information display region may be flexibly adjusted.

Using an optical fiber converter to convert display information from an electrical signal format to an optical signal format and then using an optical fiber to relay the display information to a projection unit, rather than directly sending the display information in the electrical signal format to the projection unit to project, may avoid the defect that the display information in the electrical signal format is easily affected by a magnetic field during transmission.

The above are only embodiments of the invention and should not be used to limit the scope of protection of the invention. Any modification, equivalent replacement and improvement within the spirit and principles of the invention may all be contained in the protection scope of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A control device of magnetic resonance equipment, the control device comprising:
    an information display device of the magnetic resonance equipment, the information display device comprising:
        a projector configured to acquire display information and project the display information onto a surface of a housing of the magnetic resonance equipment, the housing defining a bore hole of the magnetic resonance equipment;

a host operable to provide an electrical signal of the display information;

an optical fiber converter operable to convert the electrical signal into an optical signal; and an optical fiber operable to relay the optical signal to the projection unit;

a light capture device configured to capture light change information about a display image projected onto the housing of the magnetic resonance equipment;

a position encoder operable to determine a control instruction based on the light change information, wherein the position encoder comprises an optical position encoder;

a controller configured to control the magnetic resonance equipment based on the control instruction; and a photoelectric converter arranged between the position encoder and the controller, the photoelectric converter configured to convert a light control instruction determined by the optical position encoder to an electrical control instruction, wherein the controller is configured to control the magnetic resonance equipment based on the electrical control instruction.

2. The control device of claim 1, wherein the controller is further configured to:

control a sickbed in response to the electrical control instruction;

control sound in response to the electrical control instruction;

control a fan in response to the electrical control instruction; and control an air conditioner in response to the electrical control instruction.

3. The control device of claim 1, wherein the information display device further comprises a fixation unit operable to fix the projector.

4. The control device of claim 3, wherein the fixation unit is arranged on a surface separate from the magnetic resonance equipment.

5. The control device of claim 4, wherein the surface separate from the magnetic resonance equipment comprises a roof, a wall, or the roof and the wall of an area for accomodating the magnetic resonance equipment.

6. The control device of claim 3, wherein an arrangement position of the fixation unit is fixed or adjustable.

7. The control device of claim 1, wherein a projection range of the projector comprises an upper portion of a front opening of a rack of the magnetic resonance imaging system, a left portion of the front opening of the rack of the magnetic resonance imaging system, a right portion of the front opening of the rack of the magnetic resonance imaging system, an upper portion of a rear opening of the rack of the magnetic resonance imaging system, a left portion of the rear opening of the rack of the magnetic resonance imaging system, a right portion of the rear opening of the rack of the magnetic resonance imaging system, or any combination thereof.

8. The control device of claim 1, further comprising:

a splitter operable to:

split the display information as multiple channels of sub-display information; and send each channel of the sub-display information to a corresponding projector.

9. The control device of claim 1, wherein the projector is also configured to project the display information onto a surface separate from the magnetic resonance equipment.

10. The control device of claim 9, wherein the surface separate from the magnetic resonance equipment comprises a wall of an area for accomodating the magnetic resonance equipment.

* * * * *